United States Patent
Furihata et al.

(10) Patent No.: US 8,999,743 B2
(45) Date of Patent: Apr. 7, 2015

(54) MANUFACTURE OF SOLAR CELL MODULE

(71) Applicant: Shin-Etsu Chemical Co., Ltd., Tokyo (JP)

(72) Inventors: Tomoyoshi Furihata, Annaka (JP); Hiroto Ohwada, Annaka (JP); Naoki Yamakawa, Annaka (JP); Masahiro Hinata, Saku (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/320,790

(22) Filed: Jul. 1, 2014

(65) Prior Publication Data
US 2015/0011039 A1    Jan. 8, 2015

(30) Foreign Application Priority Data

Jul. 4, 2013   (JP) .................................. 2013-140539
Jun. 17, 2014  (JP) .................................. 2014-124107

(51) Int. Cl.
| | | |
|---|---|---|
| H01L 21/00 | (2006.01) | |
| H01L 31/18 | (2006.01) | |
| H01L 31/0203 | (2014.01) | |

(52) U.S. Cl.
CPC .......... H01L 31/188 (2013.01); H01L 31/0203 (2013.01)

(58) Field of Classification Search
None
See application file for complete search history.

(56) References Cited

U.S. PATENT DOCUMENTS

| | | | |
|---|---|---|---|
| 4,578,526 A * | 3/1986 | Nakano et al. ................ 136/251 |
| 2004/0135268 A1 * | 7/2004 | Frischknecht ................ 257/788 |
| 2005/0127379 A1 * | 6/2005 | Nakata ............................ 257/84 |
| 2006/0049396 A1 * | 3/2006 | Pichler et al. ................... 257/40 |
| 2006/0207646 A1 | 9/2006 | Terreau et al. |
| 2008/0276983 A1 | 11/2008 | Drake et al. |
| 2009/0194156 A1 * | 8/2009 | Grommesh et al. .......... 136/256 |
| 2009/0320921 A1 * | 12/2009 | Grommesh et al. .......... 136/256 |
| 2011/0061724 A1 | 3/2011 | Houle et al. |
| 2011/0247674 A1 | 10/2011 | Fujii et al. |
| 2012/0234387 A1 * | 9/2012 | Sawada et al. ................ 136/259 |

(Continued)

FOREIGN PATENT DOCUMENTS

| | | |
|---|---|---|
| JP | 2007-527109 A | 9/2007 |
| JP | 2009-515365 A | 4/2009 |

(Continued)

OTHER PUBLICATIONS

Ohl, S., et al., "Increased internal quantum efficiency of encapsulated solar cells by using two-component silicone as encapsulant material", Proc. 23rd, EU PVSEC, Valencia, Germany, 2008, pp. 2693-2697.

(Continued)

Primary Examiner — Scott B Geyer
(74) Attorney, Agent, or Firm — Westerman, Hattori, Daniels & Adrian, LLP (57) ABSTRACT

A solar cell module is manufactured by forming silicone coating films (2, 2) on panels (1a, 1b), placing a solar cell matrix (3) on the silicone coating film on panel (1a), providing a seal member (4) consisting of a base seal member (4a) of butyl rubber and protrusive seal segments (4b) of butyl rubber on a peripheral region of panel (1a), mating the two panels together such that the seal member (4) may abut against a peripheral region of panel (1b), and the solar cell matrix (3) may be sandwiched between the silicone coating films (2), and compressing and heating the mated panels (1a, 1b) in vacuum for establishing a seal around the solar cell matrix (3).

10 Claims, 5 Drawing Sheets

(56) References Cited

U.S. PATENT DOCUMENTS

2013/0178009 A1* 7/2013 Watanabe .................. 438/64
2013/0323874 A1* 12/2013 Furihata et al. ............. 438/64
2014/0020734 A1* 1/2014 Baker et al. ................ 136/251

FOREIGN PATENT DOCUMENTS

| | | | |
|---|---|---|---|
| JP | 2011-514680 A | 5/2011 | |
| JP | 2011-231309 A | 11/2011 | |
| WO | 2009/091068 A1 | 7/2009 | |

OTHER PUBLICATIONS

Ketola, Barry, et al., "Demonstration of the benefits of silicone encapsulation of PV modules in a large scale outdoor array", Dow Corning Corporation, USA, Dec. 27, 2010, (7 pages).

* cited by examiner

MANUFACTURE OF SOLAR CELL MODULE

CROSS-REFERENCE TO RELATED APPLICATION

This non-provisional application claims priority under 35 U.S.C. §119(a) on Patent Application Nos. 2013-140539 and 2014-124107 filed in Japan on Jul. 4, 2013 and Jun. 17, 2014, respectively, the entire contents of which are hereby incorporated by reference.

TECHNICAL FIELD

This invention relates to a method for manufacturing a solar cell module by encapsulating a solar cell matrix with resin.

BACKGROUND ART

To provide solar cell modules with enhanced conversion efficiency and long-term reliability over 20 to 30 years or even longer, a number of reports and proposals relating to encapsulants were made in the art. From the standpoint of efficiency enhancement, the silicone material is reported to be superior in internal quantum efficiency due to light transmittance at wavelength of about 300 to 400 nm, as compared with the ethylene-vinyl acetate copolymer (EVA) which is currently the mainstream of encapsulant (see Non-Patent Document 1, for example). In fact, an experiment to compare the output power of solar modules using EVA and silicone material as encapsulant is reported (see Non-Patent Document 2, for example).

Originally, the use of silicone material as encapsulant was already implemented in the early period of 1970s when solar cell modules for spacecraft were fabricated. Historically, in the stage when solar cell modules for ground applications were manufactured, the silicone material was replaced by EVA because the silicone material had outstanding problems including material cost and workability for encapsulation whereas the EVA was inexpensive and supplied in film form. Recently, the efficiency enhancement and long-term reliability of solar cells are highlighted again. Accordingly, the properties of silicone material as encapsulant, for example, low modulus, high transparency and weather resistance are considered valuable again. Several encapsulating methods using silicone material are newly proposed.

For example, Patent Document 1 discloses encapsulation using a sheet of organopolysiloxane-based hot melt material. However, it is difficult to work the polysiloxane into a sheet while maintaining high transparency. When the polysiloxane is shaped into a sheet of about 1 mm thick, for example, only a particular shaping technique such as casting or pressing is applicable due to the "brittleness" of the material. This shaping technique is unsuitable for mass-scale production. To ameliorate the brittleness, a filler may be admixed with the polysiloxane. Filler loading can improve moldability at the sacrifice of transparency. Patent Document 2 discloses that interconnected solar cells are positioned on or in a liquid silicone material coated on a substrate, using a multi-axis robot. The liquid silicone material is then cured, thereby achieving encapsulation without trapping air bubbles. Further, Patent Document 3 proposes that a solar cell is placed in vacuum, and the components are compressed using a cell press having a movable plate, thereby achieving encapsulation without trapping air bubbles. In these patent documents, however, no reference is made to the treatment of the solar cell module at its edge face. When silicone is used, its moisture permeability leaves a concern about the ingress of moisture. Since either of these methods differs significantly from the conventional methods of encapsulating solar cells, there is a possibility that the currently available mass-production systems cannot be used.

Patent Document 4 discloses a method of sealing a solar cell module by placing a sealing compound, a solar cell element, and a liquid silicone material on a glass substrate, then laying a back side protection substrate thereon to form a precursory laminate, and compression bonding the laminate in vacuum at room temperature. This method may be applicable with difficulty to the manufacture of solar cell modules of practical size.

Also, Patent Document 5 discloses a method of sealing a double glazed unit or solar cell panel by placing a sealing composition between peripheral bands of glass pieces in thickness direction, placing an EVA or similar resin inside the sealing composition, and heat compression bonding in vacuum. With this method, the molten EVA can be squeezed out of the peripheral bands of glass pieces in the heat compression bonding step, interfering with the adhesion of the sealing composition to the glass pieces.

Citation List

| | |
|---|---|
| Patent Document 1: | JP-A 2009-515365 (US 20080276983) |
| Patent Document 2: | JP-A 2007-527109 (US 20060207646) |
| Patent Document 3: | JP-A 2011-514680 (US 20110061724) |
| Patent Document 4: | WO 2009/091068 |
| Patent Document 5: | JP-A 2011-231309 |
| Non-Patent Document 1: | S. Ohl, G. Hahn, "Increased internal quantum efficiency of encapsulated solar cell by using two-component silicone as encapsulant material", Proc. 23rd, EU PVSEC, Valencia (2008), pp.2693-2697 |
| Non-Patent Document 2: | Barry Ketola, Chris Shirk, Phillip Griffith, Gabriela Bunea, "Demonstration of the benefits of silicone encapsulation of PV modules in a large scale outdoor array", Dow Corning Corporation |

DISCLOSURE OF INVENTION

An object of the invention is to provide a method for manufacturing a solar cell module by encapsulating a solar cell matrix between two panels with a silicone composition without leaving pores, the method enabling to use an existing solar module manufacturing apparatus, and the resulting solar cell module being fully durable in that any ingress of moisture from side edges of the module is prohibited.

The invention provides a method for manufacturing a solar cell module as defined below.

[1] A method for manufacturing a solar cell module by resin encapsulating a solar cell matrix comprising a plurality of electrically connected solar cell components between two panels, comprising the steps of:

(i) forming a silicone coating film on one surface of each of two panels, excluding a peripheral region of the one surface, (ii) placing the solar cell matrix on the silicone coating film on one panel, such that in case the solar cell component is of monofacial light receiving type, the light receiving side may face upward, and in case the solar cell component is of bifacial light receiving type, either one light receiving side may face upward, (iii) providing a base seal member on the peripheral region of the silicone coating film-bearing surface of either one panel where the silicone coating film is not formed, said seal member comprising a butyl rubber-based thermoplastic sealing material and being thicker than the silicone coating film on the panel, such that a ratio of the volume (V2) of the base seal member to the volume (V1) of a seal portion, which is given as the total thickness of the silicone coating films on the panels multiplied by the width of the peripheral region of the surface of the base seal member-bearing panel where the silicone coating film is not formed, may range from 1.2/1 to 1.5/1, and then providing protrusive seal segments on the base seal member at four or more spaced-apart positions, said protrusive seal segments comprising a butyl rubber-based thermoplastic sealing material and having a height of 1 to 4 mm, (iv) mating the two panels together such that the silicone coating film-bearing surface of the panel on which the solar cell matrix is not placed may be opposed to the solar cell matrix, a seal member consisting of the base seal member and protrusive seal segments may abut against a peripheral region of the panel on which the seal member is not provided where the silicone coating film is not formed, and the solar cell matrix may be sandwiched between the silicone coating films, (v) evacuating a space in which the mated panels are placed to vacuum, compressing and heating the mated panels in vacuum for establishing a seal around the solar cell matrix.

[2] The method of [1] wherein step (iii) includes previously forming the base seal member in tape form and the protrusive seal segments, placing the base seal member on the peripheral region of the silicone coating film-bearing surface of either one panel where the silicone coating film is not formed, and then placing the protrusive seal segments on the base seal member at four or more spaced-apart positions.

[3] The method of [1] wherein step (iii) includes previously forming the base seal member in tape form and the protrusive seal segments, placing the protrusive seal segments on the base seal member at four or more spaced-apart positions to form a seal member, and then placing the seal member on the peripheral region of the silicone coating film-bearing surface of either one panel where the silicone coating film is not formed.

[4] A method for manufacturing a solar cell module by resin encapsulating a solar cell matrix comprising a plurality of electrically connected solar cell components between two panels, comprising the steps of:

(i) forming a silicone coating film on one surface of each of two panels, excluding a peripheral region of the one surface, (ii) placing a solar cell matrix on the silicone coating film on one panel, such that in case the solar cell component is of monofacial light receiving type, the light receiving side may face upward, and in case the solar cell component is of bifacial light receiving type, either one light receiving side may face upward, (iii) providing a base seal member on the peripheral region of the silicone coating film-bearing surface of either one panel where the silicone coating film is not formed, said seal member comprising a butyl rubber-based thermoplastic sealing material and being thicker than the silicone coating film, such that a ratio of the volume (V2) of the base seal member to the volume (V1) of a seal portion, which is given as the total thickness of the silicone coating films on the panels multiplied by the width of the peripheral region of the surface of the base seal member-bearing panel where the silicone coating film is not formed, may range from 1.2/1 to 1.5/1, and providing protrusive seal segments on the peripheral region of the silicone coating film-bearing surface of the other panel where the silicone coating film is not formed, at four or more spaced-apart positions, said protrusive seal segments comprising a butyl rubber-based thermoplastic sealing material and having a height of 1 to 4 mm, (iv) mating the two panels together such that the silicone coating film-bearing surface of the panel on which the solar cell matrix is not placed may be opposed to the solar cell matrix, the protrusive seal segments may abut against the base seal member, and the solar cell matrix may be sandwiched between the silicone coating films, (v) evacuating a space in which the mated panels are placed to vacuum, compressing and heating the mated panels in vacuum for establishing a seal around the solar cell matrix.

[5] The method of [4] wherein step (iii) includes previously forming the base seal member in tape form and the protrusive seal segments, placing the base seal member on the peripheral region of the silicone coating film-bearing surface of either one panel where the silicone coating film is not formed, and placing the protrusive seal segments on the peripheral region of the silicone coating film-bearing surface of the other panel where the silicone coating film is not formed, at four or more spaced-apart positions.

[6] The method of any one of [1] to [5] wherein the silicone coating film is a silicone gel film formed by coating and curing a curable silicone gel composition and having a penetration of 30 to 200 as measured according to JIS K2220.

[7] The method of any one of [1] to [6] wherein the silicone coating film has a thickness of 200 to 1,000 μm.

[8] The method of any one of [1] to [7] wherein step (v) includes heating the mated panels in vacuum at a temperature of 70 to 120° C.

[9] The method of any one of [1] to [8] wherein step (v) is carried out using a vacuum laminator.

[10] The method of any one of [1] to [9] wherein at least one of the two panels is a transparent plate.

ADVANTAGEOUS EFFECTS OF INVENTION

According to the invention, a solar cell module is manufactured by encapsulating a solar cell matrix with silicone coating films. The method comprises the steps of (i) forming a silicone coating film on each of two panels, (ii) placing a solar cell matrix on the silicone coating film on one panel, such that in case the solar cell component is of monofacial light receiving type, the light receiving side may face upward, and in case the solar cell component is of bifacial light receiving type, either one light receiving side may face upward, (iii) providing a base seal member of predetermined volume on a peripheral region of the surface of either one panel where the silicone coating film is not formed, and providing protrusive seal segments of predetermined thickness on the base seal member at four or more spaced-apart positions, or providing a base seal member of predetermined volume on a peripheral region of the surface of either one panel where the silicone coating film is not formed, and providing protrusive seal segments of predetermined height on a peripheral region of the other panel where the silicone coating film is not formed, at four or more spaced-apart positions, (iv) mating the two panels together such that the solar cell matrix may be sandwiched between the silicone coating films, (v) evacuating a space in which the mated panels are placed to vacuum, compressing and heating the mated panels in vacuum for establishing a seal around the solar cell matrix. Steps (iv) and (v) ensure efficient evacuation of air from between the two panels, i.e., between the silicone coating film and the solar cell matrix. Step (v) enables to seal the solar cell matrix with the silicone coating films while suppressing pore formation. Since the silicone coating film is surrounded and sealed with a seal member of butyl rubber-based thermoplastic sealing material disposed on a peripheral region, no air is taken in by the module after the module is released to the atmosphere. The seal member prevents any ingress of moisture through the side edges of the module. The inventive method can be implemented by the existing solar module manufacturing apparatus using EVA film, typically vacuum laminator. Thus, solar modules can be manufactured without a need for a newly designed lamination apparatus.

DESCRIPTION OF PREFERRED EMBODIMENTS

In the following description, like reference characters designate like or corresponding parts throughout the several views shown in the figures. The terms "first", "second", and the like, as used herein do not denote any order, quantity, or importance, but rather are used to distinguish one element from another. It is also understood that terms such as "above," "below," "outward," "inward," and the like are words of convenience and are not to be construed as limiting terms.

Figure 1:
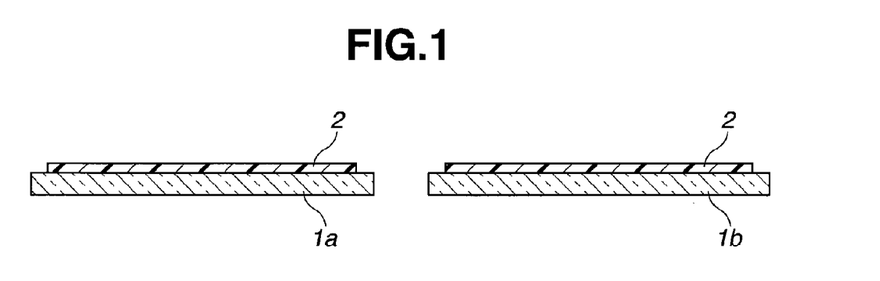
FIG. 1 is a cross-sectional view of two panels each having a silicone coating film formed thereon.
Figure 2A:
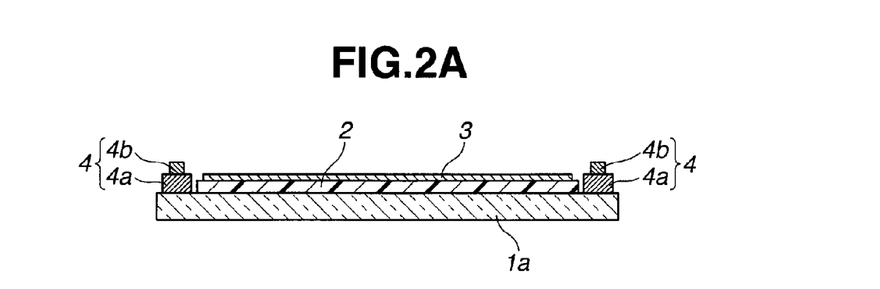
FIG. 2 illustrates one panel wherein a solar cell matrix is rested on the silicone coating film and a seal member is provided on a peripheral region thereof, (a) being a cross section taken along lines A-A in (b) and (b) being a plan view.
Figure 2B:
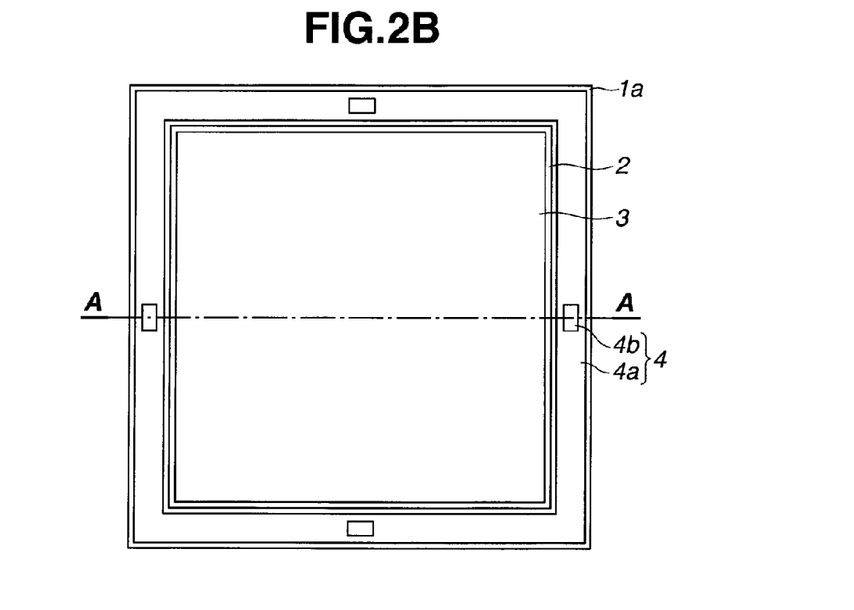
Figure 3A:
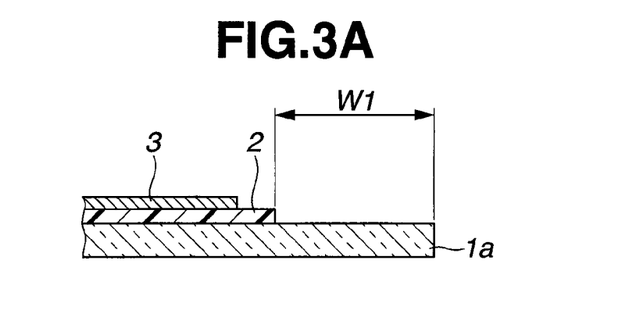
FIG. 3 is a cross-sectional view illustrating the seal member forming procedure, (a) showing a peripheral region of the panel, (b) showing a base seal member formed thereon, and (c) showing a protrusive seal segment formed thereon.
Figure 3B:
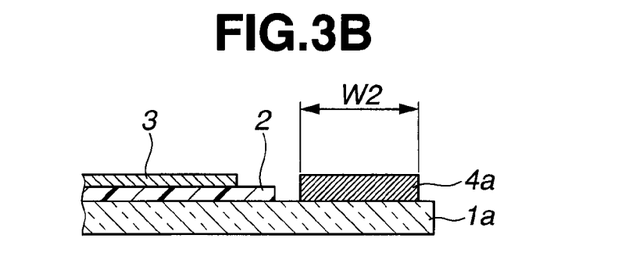
Figure 3C:
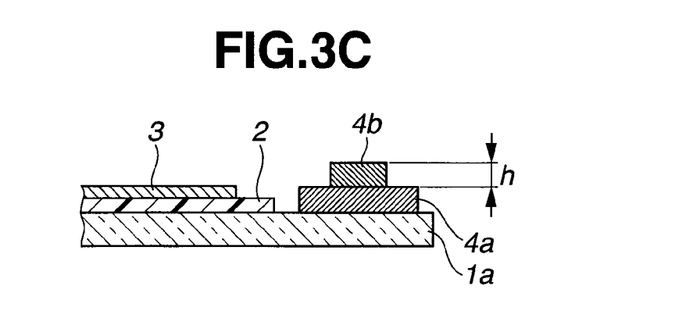
Figure 4:
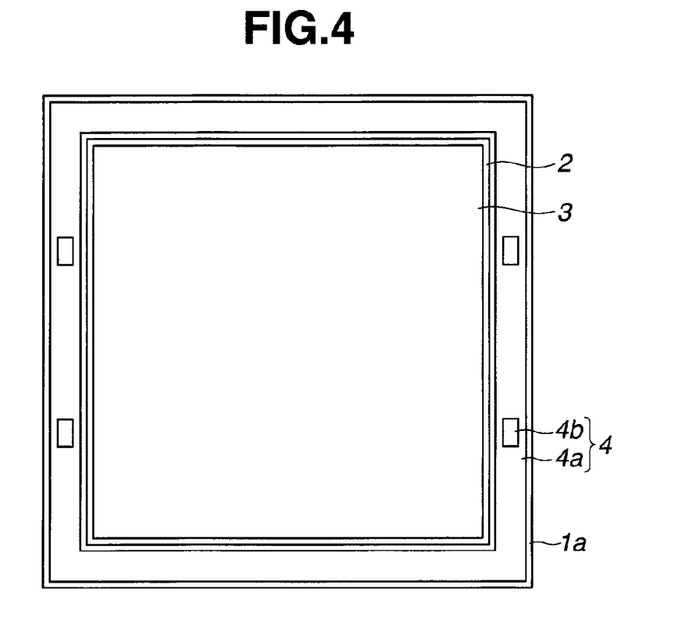
FIG. 4 is a plan view showing another arrangement of protrusive seal segments.
Figure 5A:
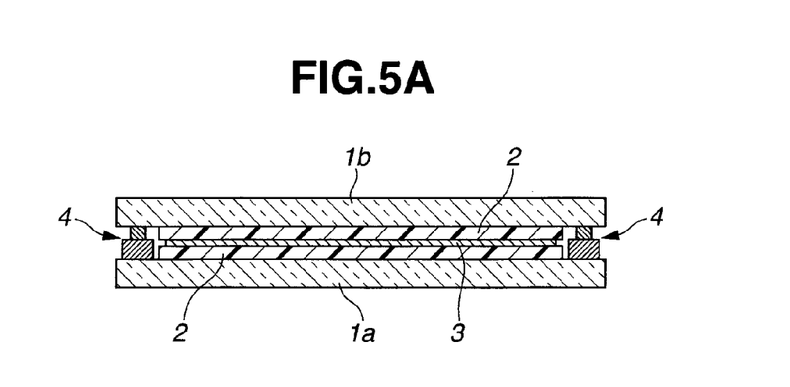
FIG. 5 is a cross-sectional view illustrating the panels mated together so as to sandwich the solar cell matrix therebetween, (a) showing the overall structure, and (b) being an enlarged view of the panel peripheral region.
Figure 5B:
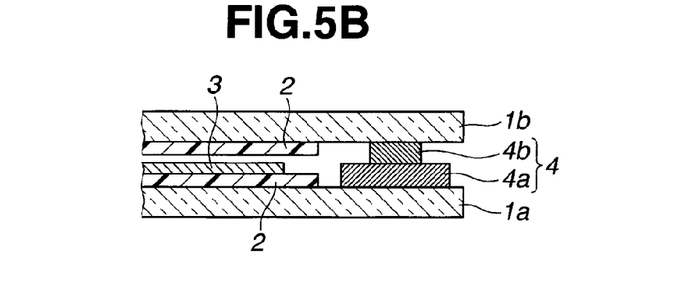

The method for manufacturing a solar cell module according to the invention is described by referring to a first embodiment. FIG. 1 illustrates in cross section two panels on which a silicone coating film is formed by applying and curing a curable silicone gel composition. FIG. 2 illustrates one panel on which a solar cell matrix is rested on the silicone coating film and a seal member is provided on a peripheral region of the panel surface where the silicone coating film is not formed. FIG. 3 illustrates the seal member forming procedure. FIG. 4 shows another arrangement of protrusive seal segments. FIG. 5 illustrates an assembly constructed by mating the other panel with one panel of FIG. 2. FIG. 6 illustrates the panel assembly obtained by vacuum laminating the two panels of FIG. 5. FIG. 7 illustrates a solar cell module in which the side edges of two panels are secured by a frame member.

(i) Step of Forming Silicone Coating Film (FIG. 1)

First of all, as shown in FIG. 1, a curable silicone gel composition is coated onto one surface of each of two panels 1a and 1b, which are transparent members, and cured to form a silicone coating film 2 thereon.

Of two panels, one panel 1a is a transparent member serving as sunlight incident side, which must remain reliable in such properties as transparency, weather resistance and shock resistance for extended periods in outdoor applications. It may be made of strengthened colorless glass, acrylic resin, fluoro-resin or polycarbonate resin, for example. Most often, strengthened colorless glass plates of about 3 to 5 mm thick are used.

The other panel 1b is disposed remote from the sunlight-incident side and opposed to one panel 1a. The other panel 1b is required to dissipate the heat of the solar cell component efficiently. It may be made of glass, synthetic resin, metal and composite materials. Exemplary glass materials include soda-lime glass, colorless glass and tempered glass. Exemplary synthetic resins include acrylic resins, polycarbonate (PC) resins, polyethylene terephthalate (PET) resins, and epoxy resins. Exemplary metal materials include copper, aluminum and iron. Exemplary composite materials include synthetic resins filled with high heat conductivity agents such as silica, titania, alumina and aluminum nitride.

If the other panel 1b disposed remote from the sunlight-incident side is a transparent member like one panel 1a on which sunlight is incident, parts of incident sunlight and scattering light may be transmitted to the remote side. Then in an example where the solar cell module is installed in a grassland, part of sunlight reaches the area of the land which is disposed below and shaded by the module, so that plants can grow even in the otherwise shaded area. This is convenient in that the module-installed region can also be utilized for pasturage.

The silicone coating film 2 is preferably formed by applying and curing a curable silicone gel composition. The crosslinking mode of the composition may be any of moisture cure, UV cure, organic peroxide cure, and addition cure with platinum catalyst. Of these, the addition cure type silicone composition is preferred because of no by-product formation and little discoloring.

The curable silicone gel composition used herein is preferably defined as comprising the following components:

(A) 100 parts by weight of an organopolysiloxane containing at least one silicon-bonded alkenyl group per molecule, represented by the average compositional formula (1):

$$R_a R^1_b SiO_{(4-a-b)/2} \tag{1}$$

wherein R is independently alkenyl, $R^1$ is independently a substituted or unsubstituted monovalent hydrocarbon group of 1 to 10 carbon atoms free of aliphatic unsaturation, a is a positive number of 0.0001 to 0.2, b is a positive number of 1.7 to 2.2, and the sum a+b is 1.9 to 2.4, (B) an organohydrogenpolysiloxane containing at least two silicon-bonded hydrogen atoms per molecule, in such an amount as to give 0.3 to 2.5 moles of silicon-bonded hydrogen per mole of silicon-bonded alkenyl in component (A), and (C) a catalytic amount of an addition reaction catalyst.

Component (A) serves as a base polymer in the curable silicone gel composition. It is an organopolysiloxane containing at least one silicon-bonded alkenyl group per molecule, represented by the average compositional formula (1).

In formula (1), R is independently an alkenyl group of 2 to 6 carbon atoms, preferably 2 to 4 carbon atoms, and more preferably 2 to 3 carbon atoms. Examples include vinyl, allyl, propenyl, isopropenyl, butenyl, and isobutenyl, with vinyl being most preferred.

$R^1$ is independently a substituted or unsubstituted monovalent hydrocarbon group free of aliphatic unsaturation, having 1 to 10 carbon atoms, preferably 1 to 6 carbon atoms. Examples of the monovalent hydrocarbon group include straight, branched or cyclic alkyl groups such as methyl, ethyl, propyl, isopropyl, butyl, isobutyl, tert-butyl, pentyl, hexyl, cyclohexyl, octyl and decyl; aryl groups such as phenyl and tolyl; aralkyl groups such as benzyl and phenylethyl; and substituted forms of the foregoing in which some or all hydrogen atoms are substituted by halogen (e.g., chloro, bromo or fluoro) such as chloromethyl and 3,3,3-trifluoropropyl. Of these, methyl, phenyl and 3,3,3-trifluoropropyl are preferred for ease of synthesis. Inter alia, methyl is most preferred in view of UV resistance.

The subscript "a" is a positive number of 0.0001 to 0.2, preferably 0.0005 to 0.1; b is a positive number of 1.7 to 2.2, preferably 1.9 to 2.02. The sum a+b is in a range from 1.9 to 2.4, preferably from 1.95 to 2.05.

The organopolysiloxane should contain at least one silicon-bonded alkenyl group per molecule, preferably 1 to 50, and more preferably 1 to 10 silicon-bonded alkenyl groups per molecule. The values of a and b may be selected so as to meet the requirement of silicon-bonded alkenyl group.

The molecular structure of the organopolysiloxane is not particularly limited. It may have a linear structure or a branched structure containing such units as $RSiO_{3/2}$, $R^1SiO_{3/2}$, and $SiO_2$ units wherein R and $R^1$ are as defined above. Preferred is an organopolysiloxane having the general formula (1a), that is, a substantially linear diorganopolysiloxane having a backbone consisting essentially of recurring diorganosiloxane units and terminated with a triorganosiloxy group at either end of the molecular chain.

(Ia)

Herein $R^2$ is independently a substituted or unsubstituted monovalent hydrocarbon group free of aliphatic unsaturation; $R^3$ is independently a substituted or unsubstituted monovalent hydrocarbon group free of aliphatic unsaturation or an alkenyl group, with the proviso that at least one $R^3$ is alkenyl; where either one of $R^3$ at opposite ends of the molecular chain is alkenyl, k is an integer of 40 to 1,200, m is an integer of 0 to 50, and n is an integer of 0 to 50; where none of $R^3$ at opposite ends of the molecular chain are alkenyl, k is an integer of 40 to 1,200, m is an integer of 1 to 50, and n is an integer of 0 to 50; and the sum m+n is at least 1.

In formula (1a), $R^2$ is independently a substituted or unsubstituted monovalent hydrocarbon group free of aliphatic unsaturation, having 1 to 10 carbon atoms, preferably 1 to 6 carbon atoms. Examples are as exemplified for $R^1$ in formula (1). Inter alia, methyl, phenyl and 3,3,3-trifluoropropyl are preferred for ease of synthesis.

Also $R^3$ is independently a substituted or unsubstituted monovalent hydrocarbon group free of aliphatic unsaturation, having 1 to 10 carbon atoms, preferably 1 to 6 carbon atoms. Examples are as exemplified for $R^1$ in formula (1). Inter alia, methyl, phenyl and 3,3,3-trifluoropropyl are preferred for ease of synthesis. Alternatively, $R^3$ is an alkenyl group of 2 to 6 carbon atoms, preferably 2 to 4 carbon atoms, and more preferably 2 to 3 carbon atoms. Examples include vinyl, allyl, propenyl, isopropenyl, butenyl, and isobutenyl, with vinyl being most preferred.

In formula (1a), where either one of $R^3$ at opposite ends of the molecular chain is alkenyl, preferably k is an integer of 100 to 1,000, m is an integer of 0 to 40, and n is 0. Where none of $R^3$ at opposite ends of the molecular chain are alkenyl, preferably k is an integer of 100 to 1,000, m is an integer of 2 to 40, and n is 0.

Examples of the organopolysiloxane of formula (1a) include, but are not limited to, both end dimethylvinylsiloxy-terminated dimethylpolysiloxane, both end dimethylvinylsiloxy-terminated dimethylsiloxane/methylvinylsiloxane copolymers, both end dimethylvinylsiloxy-terminated dimethylsiloxane/diphenylsiloxane copolymers, both end dimethylvinylsiloxy-terminated dimethylsiloxane/methylvinylsiloxane/diphenylsiloxane copolymers, both end dimethylvinylsiloxy-terminated methyltrifluoropropylpolysiloxane, both end dimethylvinylsiloxy-terminated dimethylsiloxane/methyltrifluoropropylsiloxane copolymers, both end dimethylvinylsiloxy-terminated dimethylsiloxane/methyltrifluoropropylsiloxane/methylvinylsiloxane copolymers, both end trimethylsiloxy-terminated dimethylsiloxane/vinylmethylsiloxane copolymers, both end trimethylsiloxy-terminated dimethylsiloxane/vinylmethylsiloxane/diphenylsiloxane copolymers, both end trimethylsiloxy-terminated vinylmethylsiloxane/methyltrifluoropropylsiloxane copolymers, trimethylsiloxy and dimethylvinylsiloxy-terminated dimethylpolysiloxane, trimethylsiloxy and dimethylvinylsiloxy-terminated dimethylsiloxane/methylvinylsiloxane copolymers, trimethylsiloxy and dimethylvinylsiloxy-terminated dimethylsiloxane/diphenylsiloxane copolymers, trimethylsiloxy and dimethylvinylsiloxy-terminated dimethylsiloxane/diphenylsiloxane/methylvinylsiloxane copolymers, trimethylsiloxy and dimethylvinylsiloxy-terminated methyltrifluoropropylpolysiloxane, trimethylsiloxy and dimethylvinylsiloxy-terminated dimethylsiloxane/methyltrifluoropropylsiloxane copolymers, trimethylsiloxy and dimethylvinylsiloxy-terminated dimethylsiloxane/methyltrifluoropropylsiloxane/methylvinylsiloxane copolymers, both end methyldivinylsiloxy-terminated dimethylpolysiloxane, both end methyldivinylsiloxy-terminated dimethylsiloxane/methylvinylsiloxane copolymers, both end methyldivinylsiloxy-terminated dimethylsiloxane/diphenylsiloxane copolymers, both end methyldivinylsiloxy-terminated dimethylsiloxane/methylvinylsiloxane/diphenylsiloxane copolymers, both end methyldivinylsiloxy-terminated methyltrifluoropropylpolysiloxane, both end methyldivinylsiloxy-terminated dimethylsiloxane/methyltrifluoropropylsiloxane copolymers, both end methyldivinylsiloxy-terminated dimethylsiloxane/methyltrifluoropropylsiloxane/methylvinylsiloxane copolymers, both end trivinylsiloxy-terminated dimethylpolysiloxane, both end trivinylsiloxy-terminated dimethylsiloxane/methylvinylsiloxane copolymers,
both end trivinylsiloxy-terminated dimethylsiloxane/diphenylsiloxane copolymers,
both end trivinylsiloxy-terminated dimethylsiloxane/methylvinylsiloxane/diphenylsiloxane copolymers,
both end trivinylsiloxy-terminated methyltrifluoropropylpolysiloxane,
both end trivinylsiloxy-terminated dimethylsiloxane/methyltrifluoropropylsiloxane copolymers, and
both end trivinylsiloxy-terminated dimethylsiloxane/methyltrifluoropropylsiloxane/methylvinylsiloxane copolymers.

Although the viscosity of the organopolysiloxane (A) is not particularly limited, it preferably has a viscosity at 25° C. in the range of 50 to 100,000 mPa·s, more preferably 100 to 10,000 mPa·s for ease of handling and working of the composition and the strength and flow of cured gel. Notably, the viscosity is measured at 25° C. by a rotational viscometer.

Component (B) functions as a crosslinker by reacting with component (A). It is an organohydrogenpolysiloxane containing at least two silicon-bonded hydrogen atoms (i.e., hydrosilyl or SiH groups) per molecule. The organohydrogenpolysiloxane contains preferably 2 to 30, more preferably 2 to 10, and even more preferably 2 to 5 SiH groups per molecule.

In the organohydrogenpolysiloxane, hydrogen may be attached to the silicon at the end and/or an intermediate position of the molecular chain. Its molecular structure is not particularly limited and may be linear, cyclic, branched or three-dimensional network (or resinous).

In the organohydrogenpolysiloxane, the number of silicon atoms per molecule, that is, degree of polymerization is typically 20 to 1,000. For ease of handling and working of the composition and better properties (e.g., low modulus and low stress) of cured gel, the number of silicon atoms per molecule is preferably 40 to 1,000, more preferably 40 to 400, even more preferably 60 to 300, further preferably 100 to 300, and most preferably 160 to 300. As used herein, the degree of polymerization is a weight average degree of polymerization as determined versus polystyrene standards by gel permeation chromatography (GPC) using toluene as solvent.

Typically the organohydrogenpolysiloxane has a viscosity at 25° C. of 10 to 100,000 mPa·s, preferably 20 to 10,000 mPa·s, and more preferably 50 to 5,000 mPa·s. An organohydrogenpolysiloxane which is liquid at room temperature (25° C.) is preferred.

The organohydrogenpolysiloxane preferably has the average compositional formula (2):

$$R^4{}_c H_d SiO_{(4-c-d)/2} \quad (2)$$

wherein $R^4$ is each independently a substituted or unsubstituted monovalent hydrocarbon group free of aliphatic unsaturation, c is a positive number of 0.7 to 2.2, d is a positive number of 0.001 to 0.5, and the sum c+d is 0.8 to 2.5.

In formula (2), $R^4$ is independently a substituted or unsubstituted monovalent hydrocarbon group free of aliphatic unsaturation, having 1 to 10 carbon atoms, preferably 1 to 6 carbon atoms. Examples of the monovalent hydrocarbon group include straight, branched or cyclic alkyl groups such as methyl, ethyl, propyl, isopropyl, butyl, isobutyl, tert-butyl, pentyl, neopentyl, hexyl, cyclohexyl, octyl, nonyl, and decyl; aryl groups such as phenyl, tolyl, xylyl and naphthyl; aralkyl groups such as benzyl, phenylethyl and phenylpropyl; and substituted forms of the foregoing in which some or all hydrogen atoms are substituted by halogen (e.g., chloro, bromo or fluoro) such as 3,3,3-trifluoropropyl. Of these, alkyl, aryl and 3,3,3-trifluoropropyl groups are preferred, and methyl, phenyl and 3,3,3-trifluoropropyl are most preferred.

The subscript c is a positive number of 0.7 to 2.2, preferably 1.0 to 2.1; d is a positive number of 0.001 to 0.5, preferably 0.001 to 0.1, and more preferably 0.005 to 0.1, even more preferably 0.005 to 0.05, and most preferably 0.005 to 0.03; and the sum c+d is in a range of 0.8 to 2.5, preferably 1.0 to 2.5, and more preferably 1.5 to 2.2.

Examples of the organohydrogenpolysiloxane having formula (2) include, but are not limited to,
methylhydrogensiloxane/dimethylsiloxane cyclic copolymers,
both end trimethylsiloxy-terminated methylhydrogenpolysiloxane,
both end trimethylsiloxy-terminated dimethylsiloxane/methylhydrogensiloxane copolymers,
both end dimethylhydrogensiloxy-terminated dimethylpolysiloxane,
both end dimethylhydrogensiloxy-terminated dimethylsiloxane/methylhydrogensiloxane copolymers,
both end trimethylsiloxy-terminated methylhydrogensiloxane/diphenylsiloxane copolymers,
both end trimethylsiloxy-terminated methylhydrogensiloxane/diphenylsiloxane/dimethylsiloxane copolymers,
both end dimethylhydrogensiloxy-terminated methylhydrogensiloxane/dimethylsiloxane/diphenylsiloxane copolymers,
copolymers consisting of $(CH_3)_2HSiO_{1/2}$, $(CH_3)_3SiO_{1/2}$ and $SiO_{4/2}$ units,
copolymers consisting of $(CH_3)_2HSiO_{1/2}$ and $SiO_{4/2}$ units, and
copolymers consisting of $(CH_3)_2HSiO_{1/2}$, $(C_6H_5)SiO_{3/2}$ and $SiO_{4/2}$ units.

An appropriate amount of component (B) used is at least 1 part, preferably at least 3 parts by weight per 100 parts by weight the component (A). When the upper limit is taken into account, an appropriate amount of component (B) used is 15 to 500 parts, more preferably 20 to 500 parts, and even more preferably 30 to 200 parts by weight per 100 parts by weight the component (A). In addition to the above requirement, component (B) should be used in such amounts as to give 0.3 to 2.5 moles, preferably 0.5 to 2 moles, and more preferably 0.6 to 1.5 moles of silicon-bonded hydrogen per mole of silicon-bonded alkenyl groups in component (A). If the amount of component (B) is less than 1 part by weight, the cured product is likely to oil bleeding. An SiH/alkenyl molar ratio of less than 0.3/1 may provide an insufficient crosslinking density, indicating that the composition may not be fully cured or if cured, the cured product may have poor heat resistance. An SiH/alkenyl molar ratio of more than 2.5/1 may give rise to problems including bubbling due to dehydrogenation reaction, poor heat resistance and oil bleeding of the cured product.

Component (C) is a catalyst for promoting addition reaction between silicon-bonded alkenyl groups in component (A) and silicon-bonded hydrogen atoms (i.e., SiH groups) in component (B). The catalyst is typically a platinum group metal based catalyst which is selected from many well-known catalysts. Examples include platinum black, chloroplatinic acid, alcohol-modified products of chloroplatinic acid, and complexes of chloroplatinic acid with olefins, aldehydes, vinylsiloxanes or acetylene alcohols.

The catalyst is added in a catalytic amount, which may be properly determined depending on the desired cure rate. The catalyst is typically added in such amounts as to give 0.1 to 1,000 ppm, preferably 1 to 300 ppm of platinum atom based on the total weight of components (A) and (B). If the amount of the catalyst is too much, the cured product may have poor heat resistance.

The curable silicone gel composition may be prepared by mixing the foregoing components (A) to (C) and optional components (if used) in a standard way. Upon formulation, the composition may be divided into two or multiple parts, if desired. For example, the composition is divided into one part composed of a portion of component (A) and component (C), and another part composed of the remainder of component (A) and component (B), and these two parts are mixed together on use.

The curable silicone gel composition thus obtained is coated onto one surface of panel 1a which is a transparent member on the sunlight incident side and one surface of panel 1b which is disposed remote from the sunlight incident side, and cured to form silicone coating films 2.

Coating Step

On coating, any of standard techniques such as spray coating, curtain coating, knife coating, screen coating, and combinations thereof may be used. The coating weight is preferably adjusted such that the silicone coating film 2 as cured may have a thickness of 200 to 1,000 μm, more preferably 300 to 800 μm. If the coating thickness is less than 200 μm, the following problems may arise. The advantageous properties of silicone gel including low modulus are not fully available. In the step of pressing the panels with a solar cell matrix sandwiched therebetween, the coating film allows the solar cell components to be cracked. In an outdoor environment where temperature fluctuates, the coating film fails to accommodate differences in coefficient of linear expansion and modulus from the electrical connection on the solar cell component surface, allowing the solar cell components to become brittle. If the coating thickness exceeds 1,000 μm, a longer time may be taken for curing and an increased amount of the curable silicone gel composition coated may add to the expense.

Curing Step

After panels 1a, 1b are coated with the curable silicone gel composition, it is heat cured at 80 to 150° C. for 5 to 30 minutes in a conventional manner to form silicone coating films 2 on panels 1a, 1b.

The silicone coating film thus formed should preferably have a penetration of 30 to 200, more preferably 40 to 150, as measured according to JIS K2220 using ¼ cone. If the penetration of a coating is less than 30, the following problems may arise. The advantageous properties of cured silicone gel including low modulus are not fully available. In the step of pressing the panels with a solar cell matrix sandwiched therebetween, the coating film allows the solar cell components to be cracked. In an outdoor environment where temperature fluctuates, the coating film fails to accommodate differences in coefficient of linear expansion and modulus from the electrical connection on the solar cell surface, allowing the solar cell components to become brittle. If the penetration of a coating film exceeds 200, the cured silicone gel may flow, failing to retain its shape.

When one surface of panel 1a, 1b is coated with the silicone gel composition, a peripheral region of the panel surface (i.e., silicone coating film-bearing surface), for example, a peripheral band (like a molding of a picture frame) having a width of 5 to 20 mm should be left uncoated. In the next step, a seal member of butyl rubber based thermoplastic sealing material is disposed on this uncoated (or bare) region. If the silicone gel composition is present, even slightly, on the peripheral region of the panel surface, it adversely affects the adhesion between the seal member and the panel, and moisture can ingress through such defective bonds to threaten the long-term reliability of the solar cell module. Therefore, to keep the peripheral region of the panel surface uncoated, the peripheral region of the panel surface is masked with masking tape (like a frame molding) before the curable silicone gel composition is coated to the panel surface. Alternatively, using a dispenser, for example, a silicone rubber material is coated in a frame pattern to form a dam before the curable silicone gel composition is coated to the panel surface. The dam functions to prevent the curable silicone rubber composition from flowing over the dam. Then the composition does not stick to the peripheral region.

(ii) Step of Placing Solar Cell Matrix (FIG. 2)

Next, a solar cell matrix 3 is placed on the silicone coating film 2 on either one of two panels 1a, 1b. Herein, reference is made to the embodiment of FIG. 2 wherein a solar cell matrix 3 is placed on the silicone coating film 2 on one panel 1a. The solar cell matrix 3 is constructed by arranging a plurality of solar or photovoltaic cell components in columns and rows and electrically connecting them while the solar cell components are formed using a silicon material (or silicon substrate) selected from monocrystalline silicon and multicrystalline silicon or both. Typically, the solar cell matrix 3 is constructed by electrically connecting 2 to 12 solar cell components in series via interconnectors such as tab wires to form a solar cell string, arranging a plurality of such strings in parallel and electrically connecting the strings in series. Typically, the solar cell matrix 3 is composed of 4 to 60 solar cell components.

The solar cell component is preferably of bifacial light-receiving type. In this case, both panels 1a and 1b are transparent.

The solar cell components of the solar cell matrix may be of monofacial or bifacial light receiving type. Particularly when monofacial solar cell components are used, the solar cell matrix 3 must be placed on the silicone coating film 2 such that the light receiving side may face upward and the opposite side be contiguous with the silicone coating film 2 on panel 1a. In the case of the monofacial solar cell component, since the side (back side) opposite to the light receiving side is covered with a back side electrode of aluminum, the component as a whole tends to warp such that the light receiving side may be convex. If the solar cell matrix is placed such that the light receiving side of solar cell components of such configuration may face downward and be contiguous with the silicone coating film 2, it is difficult to draw air from between finger electrodes on the light receiving side during the step of sealing the matrix sandwiched between panels (as will be described later), leaving pores. When the solar cell components are of monofacial type, panel 1a presents a surface which is disposed remote from the sunlight-incident surface, in the solar cell module.

In the case where the solar cell components are of bifacial light receiving type, the orientation of the solar cell matrix 3 on the silicone coating film 2 on panel 1a is not particularly limited, that is, either of the light receiving sides may face upward.

(iii) Step of Providing Seal Member (FIGS. 2, 3 and 4)

As shown in FIG. 2, a seal member 4 consisting of a base seal member 4a and protrusive seal segments 4b is provided on the peripheral region of the silicone coating film-bearing surface of one panel 1a where the silicone coating film 2 is not formed. The seal member 4a of a predetermined volume comprises a butyl rubber-based thermoplastic sealing material and is thicker than the silicone coating film 2 on panel 1a. The protrusive seal segments 4b are arranged on the base seal member 4a at four or more spaced-apart positions, the protrusive seal segments comprising a butyl rubber-based thermoplastic sealing material and having a height of 1 to 4 mm. Note that FIG. 2 (a) is a cross-sectional view taken along lines A-A in FIG. 2 (b).

The base seal member 4a and protrusive seal segments 4b of which the seal member 4 is composed are made of a butyl rubber-based thermoplastic sealing material, which may be any of commercially available butyl rubber-based sealing materials. Since the subsequent step of vacuum lamination applies heat at a temperature of 70 to 120° C., a sealing material of hot melt type capable of retaining its shape in that temperature range is preferred. A suitable hot melt sealing material is available under the trade name Hot Melt M-155P (adhesive for solar modules) from Yokohama Rubber Co., Ltd.

FIG. 3 illustrates the procedure of forming seal member 4.

As shown in FIG. 3 (a), the peripheral region of panel 1a is a bare region having width W1 where the silicone coating film 2 is not formed. The width W1 of the bare region is determined from the relationship of the seal factor of module edge to the area of the light receiving surface and is preferably 5 to 20 mm.

Next, as shown in FIGS. 2 (b) and 3 (b), the base seal member 4a having width W2 is provided in a frame pattern on the peripheral region of panel 1a where the silicone coating film 2 is not formed. The base seal member 4a occupies the majority of the volume of the seal member 4 for sealing the edges of the solar cell module.

The width W2 of base seal member 4a is preferably 50 to 80%, more preferably 55 to 75% of the width W1 of the bare or peripheral region of panel 1a. If W2 is less than 50% of W1, the seal member 4 may not be uniformly spread over a portion to be sealed (or seal portion) at the edge of the solar cell module during the vacuum lamination step (to be described later). If W2 is more than 80% of W1, the material of base seal member 4a may penetrate into the silicone coating film 2 on the inside region of panel 1a.

The base seal member 4a is provided such that a ratio of the volume (V2) of the base seal member 4a to the volume (V1) of a seal portion, which is given as the total thickness of the silicone coating films on the panels multiplied by the width of the peripheral region of the surface of the base seal member-bearing panel where the silicone coating film is not formed, may range from 1.2/1 to 1.5/1, preferably from 1.3/1 to 1.5/1. If the ratio V2/V1 is less than 1.2, the seal portion may not be fully filled with the seal member 4 or the seal member 4 may not be uniformly spread. If the ratio V2/V1 exceeds 1.5, the material of base seal member 4a may penetrate into the silicone coating film 2 on the inside region of panel 1a or be extruded out of the panels. Since the ratio (V2/V1) of the volume (V2) of the base seal member 4a to the volume (V1) of a portion to be sealed (or seal portion) at the edge of the solar cell module is also regarded as a ratio of the cross-sectional area of base seal member 4a to the cross-sectional area of the seal portion, the ratio may be determined according to the following equation (A), provided that the cross-sectional shape is rectangular.

$$V2/V1 = (\text{thickness} \times \text{width } W2 \text{ of base seal member } 4a)/[(\text{total thickness of silicone coating films 2 on panels } 1a, 1b) \times (\text{width } W1 \text{ of peripheral or bare region of panel } 1a)] \quad (A)$$

Accordingly, the thickness of base seal member 4a is determined from the relationship of ratio V2/V1, thickness of silicone coating film 2, and widths W1 and W2. For example, the thickness of base seal member 4a is preferably 1 to 4 mm, more preferably 2 to 3 mm.

With respect to the location of base seal member 4a on the peripheral or bare region of panel 1a, base seal member 4a preferably extends from a position retracted slightly inside from the edge of panel 1a to a position spaced apart from the silicone coating film 2, as shown in FIG. 3 (b). This limited extension inhibits seal member 4 from penetrating into silicone coating film 2 and also prevents seal member 4 from being extruded out of the edge of the solar cell module during the vacuum lamination step of sealing the edge of the solar cell module.

The base seal member 4a may be provided by any desired ways. Using a hot-melt applicator, for example, the butyl rubber-based thermoplastic sealing material is coated to the peripheral or bare region of panel 1a where the silicone coating film 2 is not formed. Alternatively, the butyl rubber-based thermoplastic sealing material is previously shaped as a piece of tape, which is extended on the peripheral region. In either way, base seal member 4a is preferably rectangular in cross-sectional shape (FIG. 3 (b)). If the cross-sectional shape is triangular, round or dome rather than rectangular, base seal member 4a provides a point support to the pressure from the opposite panel 1b during the vacuum lamination step so that base seal member 4a may quickly collapse down, leading to incomplete deaeration between silicone coating films 2 on panels 1a, 1b.

Next, as shown in FIG. 3 (c), protrusive seal segments 4b of butyl rubber-based thermoplastic sealing material are placed on base seal member 4a at four or more spaced-apart positions, with at least one protrusive seal segment being assigned to each of four sides of base seal member 4a.

The protrusive seal segments 4b serve to define a communication space for air passage between base seal member 4a and panel 1b during the subsequent steps of mating the panels 1a and 1b together and vacuum evacuation. The protrusive seal segments 4b should have a height h of 1 to 4 mm, preferably 2 to 3 mm. If the height h is less than 1 mm, the evacuation between silicone coating films 2 on panels 1a, 1b during the vacuum lamination step becomes incomplete, leaving pores in silicone coating films 2. If the height h is more than 4 mm, the vacuum lamination step fails in uniform compression of two panels 1a, 1b, causing damage to the solar cell matrix 3.

The width of protrusive seal segments 4b, which is parallel to the width W2 of base seal member 4a, is typically narrower than the width W2, and preferably in a range of 2 to 5 mm, more preferably 3 to 4 mm. The length of protrusive seal segments 4b is parallel to the length direction of base seal member 4a (i.e., length direction of frame side), and preferably in a range of 5 to 50 mm, more preferably 10 to 30 mm.

The protrusive seal segments 4b may be provided by any desired ways. Using a hot-melt applicator, for example, the butyl rubber-based thermoplastic sealing material is coated on the base seal member 4a. Alternatively, the butyl rubber-based thermoplastic sealing material is previously shaped as a web of tape, the web is cut into segments, and each segment is placed on the base seal member 4a. In either way, protrusive seal segments 4b are preferably rectangular in cross-sectional shape (FIG. 3 (c)). If the cross-sectional shape is triangular, round or dome rather than rectangular, protrusive seal segments 4b provide a point support to the pressure from the opposite panel 1b during the vacuum lamination step so that protrusive seal segments 4b may quickly collapse down, leading to incomplete deaeration between silicone coating films 2 on panels 1a, 1b. Accordingly, protrusive seal segments 4b are preferably of quadrangular prism shape.

The protrusive seal segments 4b are arranged on base seal member 4a at four or more positions. If the number of protrusive seal segments 4b is 3 or less, the distance between panels 1a and 1b at their peripheral edge when panels 1a and 1b are mated together, that is, the height of the communication space between panel 1b and base seal member 4a becomes non-uniform, and evacuation and compression in this state during the vacuum lamination step leads to incomplete evacuation between panels 1a and 1b.

The number of protrusive seal segments 4b is preferably even. Also preferably, the protrusive seal segments 4b are equally spaced apart and arranged on four sides of panel 1a one by one, and specifically arranged in point symmetry on four sides of a rectangular frame defined by base seal member 4a and about the center of the rectangle. Alternatively, half of protrusive seal segments 4b are equally spaced apart and arranged on each of two opposed sides among four sides. In either case, panel 1b is uniformly supported by protrusive seal segments 4b when panels 1a and 1b are mated together, and the distance between panels 1a and 1b becomes uniform.

FIG. 2 (b) shows one preferred arrangement of four protrusive seal segments 4b on base seal member 4a at four positions. Specifically, four protrusive seal segments 4b are positioned substantially at the center of four sides of base seal member 4a, respectively. Although FIG. 2 (b) is a plan view, for ease of understanding, each part in FIG. 2 (b) is hatched in the same pattern as the corresponding part in FIG. 2 (a).

FIG. 4 shows another preferred arrangement of four protrusive seal segments 4b on base seal member 4a at four positions. Specifically, two protrusive seal segments 4b are equally spaced apart and arranged on each of two opposed sides among four sides of base seal member 4a. Although FIG. 4 is a plan view, for ease of understanding, each part in FIG. 4 is hatched in the same pattern as the corresponding part in FIG. 2 (a).

In the illustrated embodiment, seal member 4 is constructed by placing base seal member 4a on the peripheral region of the silicone coating film-bearing surface of panel 1a where the silicone coating film is not formed, and then placing protrusive seal segments 4b on the base seal member 4a at four or more spaced apart positions. Alternatively, base seal member 4a is previously shaped in tape form and protrusive seal segments 4b are obtained by previously shaping in tape form and cutting to segments, protrusive seal segments 4b are placed on base seal member 4a at four or more spaced apart positions to construct seal member 4, and seal member 4 is placed on the peripheral region of the silicone coating film-bearing surface of either one of panels 1a and 1b where the silicone coating film is not formed.

Furthermore, in the illustrated embodiment, seal member 4 is formed on the peripheral region of the silicone coating film-bearing surface of panel 1a having solar cell matrix 3 where the silicone coating film is not formed. The seal member 4 may also be formed on panel 1b not having solar cell matrix 3. In this case, seal member 4 is formed on the peripheral region of the silicone coating film-bearing surface of panel 1b where the silicone coating film is not formed, while seal member 4 consists of base seal member 4a disposed in contact with panel 1b and protrusive seal segments 4b disposed thereon. Alternatively, seal member 4 consists of protrusive seal segments 4b disposed in contact with panel 1b and base seal member 4a disposed thereon.

(iv) Step of Mating Panels (FIG. 5)

Next, as shown in FIG. 5 (a), the one and other panels 1a and 1b are mated or joined together such that the silicone coating film-bearing surface of panel 1b on which the solar cell matrix is not placed may be opposed to the solar cell matrix 3 on the silicone coating film-bearing surface of panel 1a, seal member 4 may abut against the peripheral region of the panel 1b on which the seal member is not provided where the silicone coating film is not formed, and the solar cell matrix 3 may be sandwiched between the silicone coating films 2.

At this point, as shown in FIG. 5 (b), panel 1b is physically supported by protrusive seal segments 4b, which are spaced apart from each other and disposed on base seal member 4a. Then a gap is left between the panel 1b and the base seal member 4a that can provide fluid communication between the exterior of panel 1b and any space between panels 1a and 1b. The solar cell matrix 3 on the silicone coating film-bearing surface of panel 1a is spaced apart from the silicone coating film 2 on panel 1b. This mating step may be carried out within the confines of a vacuum laminator (module laminator) to be described later.

(v) Step of Vacuum Lamination (FIG. 6)

Next, the precursory laminate or assembly of two panels 1a, 1b with solar cell matrix 3 sandwiched therebetween as shown in FIG. 5 is vacuum laminated. Specifically, using a vacuum laminator (not shown), the chamber receiving the assembly is evacuated, and two panels 1a, 1b are pressed together and heated in vacuum, for thereby sealing the solar cell matrix 3.

The vacuum laminator used herein may be a laminator comprising two adjacent vacuum tanks partitioned by a flexible membrane, as commonly used in the manufacture of solar cell modules. For example, the precursory assembly of panels 1a, 1b as shown in FIG. 5 is set in one tank, two tanks are pumped to vacuum, so that a substantial vacuum, specifically below ~130 Pa, is established between panels 1a and 1b. At the same time, at least outer portions of panels 1a, 1b are heated. Thereafter, while the one tank having the precursory assembly of panels 1a, 1b set therein is kept in vacuum, the other tank is released to atmospheric pressure or even kept under an applied pressure, whereby the panels 1a, 1b are compressed in their thickness direction by the membrane. For example, the tank receiving the assembly is evacuated to vacuum to remove air from the space between silicone coating film 2 and solar cell matrix 3, the space between solar cell strings in matrix 3, and the space between silicone coating films 2. The assembly is heated at 70 to 120° C. and held at the temperature for 3 to 15 minutes. With the heated state kept, the other tank is released to atmospheric pressure, whereby panels 1a, 1b are compressed by the membrane for 3 to 15 minutes. Then solar cell matrix 3 is tightly sealed between panels 1a, 1b.

Figure 6A:
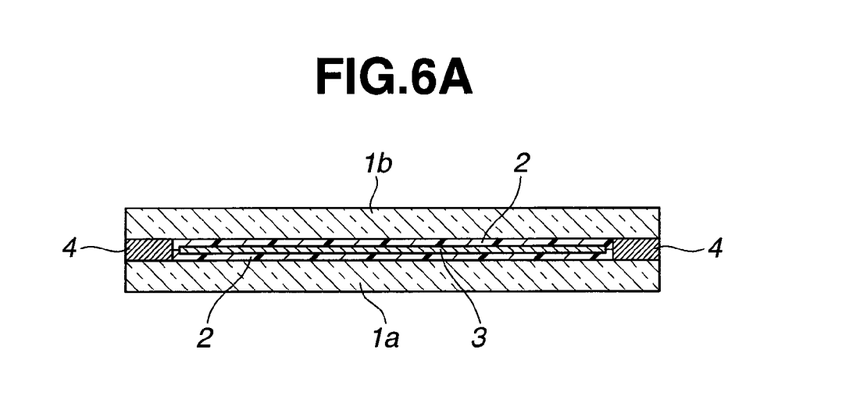
FIG. 6 is a cross-sectional view of the panel assembly which is laminated by a vacuum laminator for establishing a seal around the solar cell matrix, (a) showing the overall structure, and (b) being an enlarged view of the panel peripheral region.
Figure 6B:
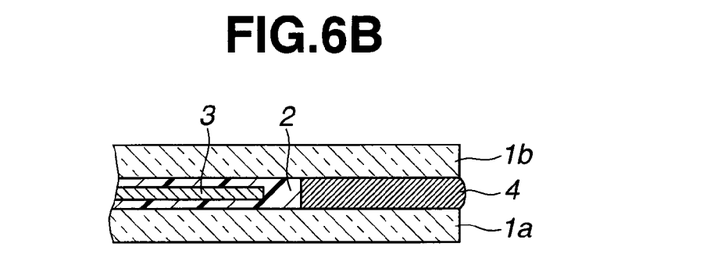
Figure 7:
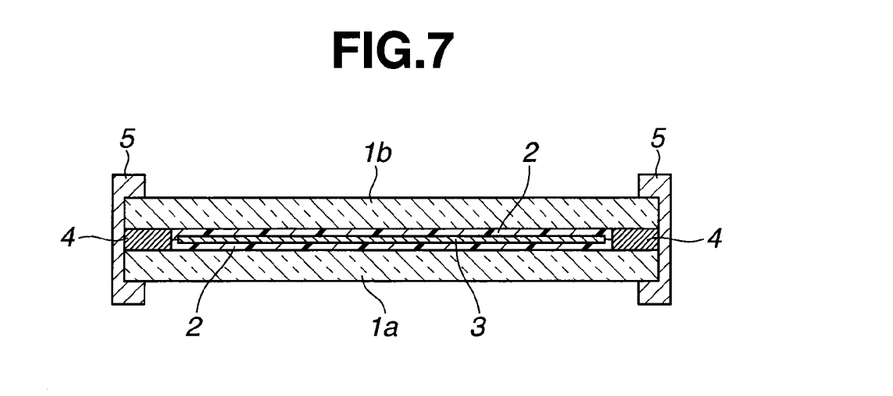
FIG. 7 is a cross-sectional view of a solar cell module after frame mounting.

Since silicone coating films 2 on panels 1a, 1b are pressed to each other in vacuum after substantial evacuation, as shown in FIG. 6(a), silicone coating films 2 are closely bonded and merged into an integral encapsulant layer without trapping air bubbles. Since silicone coating films 2 preferably have a specific penetration, the solar cell matrix 3 is embedded in the encapsulant layer without failures. Since a pressure acting in a direction to press panels 1a, 1b is applied to base seal member 4a and protrusive seal segments 4b which are heated at the predetermined temperature, protrusive seal segments 4b are forced into base seal member 4a to form integrated seal member 4. The thus integrated seal member 4 of certain thickness tightly seals the peripheral region of the surface of panels 1a, 1b and the peripheral edges of the silicone coating films 2 and bonds to the panels 1a, 1b as shown in FIG. 6 (b). As a result, the seal member 4 tightly encloses the silicone coating films 2 together with two panels 1a, 1b, preventing the ingress of moisture and gas into the solar cell module from its edge faces. The resulting solar cell module is thus of fully durable performance.

(vi) Step of Framing (FIG. 7)

As shown in FIG. 7, a frame member 5 is mounted on the outer periphery of the panels 1a, 1b as press bonded, completing a solar cell module.

The frame member 5 is preferably made of aluminum alloy, stainless steel or similar material having strength against shocks, wind pressure or snow deposition, weather resistance, and lightweight. The frame member 5 of such material is mounted so as to enclose the outer periphery of the assembly of panels 1a, 1b having the solar cell matrix 3 sandwiched therebetween and fixedly secured to the panels by screws (not shown).

In the solar cell module thus constructed, since the solar cell matrix 3 is held by flat panels 1a, 1b via silicone coating films 2, the solar cell module, when considered as a panel, is minimized in variation of light-receiving angle relative to sunlight and thus exerts consistent performance. According to the inventive method, solar cell modules of consistent performance can be easily manufactured in a large scale.

Figure 8:
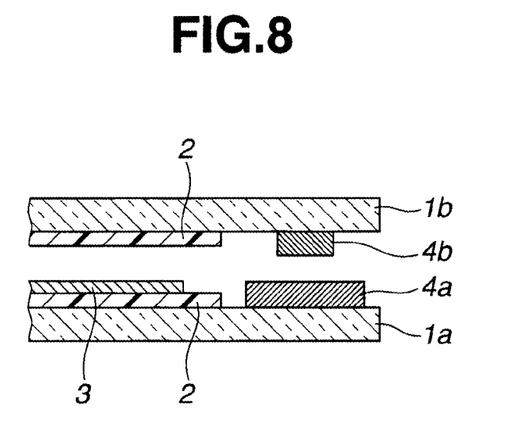
FIG. 8 is a cross-sectional view showing another embodiment of providing the seal member.

In the first embodiment illustrated above, step (iii) is by providing both base seal member 4a and protrusive seal segments 4b on the peripheral region of the silicone coating film-bearing surface of either one of panels 1a, 1b wherein the silicone coating film is not formed, but not limited thereto. In a second embodiment, step (iii) is modified as follows. As shown in FIG. 8, a base seal member 4a is provided on the peripheral region of the silicone coating film-bearing surface of either one panel (panel 1a in FIG. 8) where the silicone coating film is not formed, the seal member comprising a butyl rubber-based thermoplastic sealing material and being thicker than silicone coating film 2 on the corresponding panel, such that the ratio (V2/V1) of equation (A) may range from 1.2 to 1.5, preferably from 1.3 to 1.5 and protrusive seal segments are provided on the peripheral region of the silicone coating film-bearing surface of the other panel (panel 1b in FIG. 8) where the silicone coating film is not formed, at four or more spaced-apart positions, the protrusive seal segments comprising a butyl rubber-based thermoplastic sealing material and having a height of 1 to 4 mm. In the second embodiment, step (iv) is also modified. The two panels are mated together such that the silicone coating film-bearing surface of the panel (panel 1b in FIG. 8) not having the solar cell matrix may be opposed to solar cell matrix 3, protrusive seal segments 4b may abut against base seal member 4a, and solar cell matrix 3 may be sandwiched between the silicone coating films 2. This results in the assembly shown in FIG. 5. Previous steps (i) and (ii) and subsequent steps (v) and (vi) are the same as in the first embodiment.

Like the first embodiment, the second embodiment establishes a seal around the solar cell matrix. Since silicone coating films 2 on panels 1a, 1b are fully deaerated and pressed to each other in vacuum, as shown in FIG. 6 (a), silicone coating films 2 are closely bonded and merged into an integral encapsulant layer without trapping air bubbles. Since silicone coating films 2 preferably have a specific penetration, the solar cell matrix 3 is embedded in the encapsulant layer without failures. Since a pressure acting in a direction to press panels 1a, 1b is applied to base seal member 4a and protrusive seal segments 4b which are heated at the predetermined temperature, protrusive seal segments 4b are forced into base seal member 4a and integrated to form seal member 4. The thus integrated seal member 4 of certain thickness tightly seals the peripheral region of the surface of panels 1a, 1b and the peripheral edges of the silicone coating films 2 and bonds to the panels 1a, 1b as shown in FIG. 6 (b). As a result, the seal member 4 tightly encloses the silicone coating films 2 together with two panels 1a, 1b, preventing the ingress of moisture and gas into the solar cell module from its edge faces. The resulting solar cell module is thus of fully durable performance.

EXAMPLE

Examples of the invention are given below by way of illustration and not by way of limitation. It is noted that the viscosity is measured at 25° C. by a rotational viscometer. All parts and percents are by weight. Vi stands for vinyl.

Synthesis Example 1

A silicone coating composition was prepared by mixing 100 parts of both end dimethylvinylsiloxy-terminated dimethylpolysiloxane having a viscosity of 1,000 mPa·s, 63 parts of both end trimethylsiloxy-terminated dimethylsiloxane/methylhydrogensiloxane copolymer represented by the formula (3) and having a viscosity of 1,000 mPa·s (to give 1.05 silicon-bonded hydrogen in component (B) per silicon-bonded alkenyl in component (A), that is, H/Vi ratio=1.05), and 0.05 part of a dimethylpolysiloxane solution of chloroplatinic acid-vinylsiloxane complex (platinum concentration 1%) until uniform.

(3)

When the composition was cured in an oven at 120° C. for 30 minutes, the cured gel product had a penetration of 70. It is noted that the penetration was measured according to JIS K2220 with a ¼ cone, using an automatic penetrometer RPM-101 by Rigo Co., Ltd.

Synthesis Example 2

A silicone coating composition was prepared by mixing 100 parts of both end trimethylsiloxy-terminated dimethylsiloxane/methylvinylsiloxane copolymer represented by the formula (4) and having a viscosity of 1,000 mPa·s, 40 parts of both end dimethylhydrogensiloxy-terminated dimethylpolysiloxane represented by the formula (5) and having a viscosity of 600 mPa·s (to give a H/Vi ratio of 0.95), and 0.05 part of a dimethylpolysiloxane solution of chloroplatinic acid-vinylsiloxane complex (platinum concentration 1%) until uniform.

(4)

(5)

When the composition was cured in an oven at 120° C. for 10 minutes, the cured gel product had a penetration of 120.

Example 1

A solar cell module was manufactured according to the first embodiment of the invention.

There were furnished two strengthened colorless glass plates of 1,000 mm×1,650 mm. The composition of Synthesis Example 1 was applied to each glass plate by the knife coating technique and heated in an oven at 120° C. for 10 minutes to form a silicone coating of 900 μm thick. Prior to the application by the knife coating technique, a peripheral region of the glass plate having a width of 15 mm was previously masked in a frame pattern with a masking tape.

After curing, a 10/6 series solar cell matrix was rested on the silicone coating on one glass plate, with the light-receiving surface faced upward. The cell matrix was constructed by arranging 60 monocrystalline silicon solar cell components of monofacial light receiving type in a matrix of 10 rows and 6 columns and electrically connecting them in series.

Next, the masking tape was peeled from the one glass plate on which the solar cell matrix was rested. Using a hot melt applicator, a butyl rubber-based thermoplastic sealing material (hot melt M-155P by Yokohama Rubber Co., Ltd.) was dispensed on the peripheral region of 15 mm wide and shaped into a band of rectangular shape in cross section having a width of 12 mm and a thickness of 3 mm as a base seal member. At this point, the base seal member was situated at the center in width direction of the peripheral or bare region of the glass plate (i.e., width direction of masking tape). Separately, the same butyl rubber-based thermoplastic sealing material was dispensed by means of a hot melt applicator and shaped into a band of rectangular shape in cross section having a width of 4 mm and a height of 2 mm; the band was cut into segments of 20 mm long as protrusive seal segments. Six protrusive seal segments were placed on the base seal member at 6 spaced apart positions. Notably, six protrusive seal segments were arranged on the base seal member such that in width direction, each protrusive seal segment was at the center of the base seal member, and along four sides of frame-configured base seal member, one was positioned at the center in each of two short sides, and two were equally spaced apart from the center in each of two long sides.

Two glass plates were mated together, with their edges kept flush, such that the silicone coating on the other glass plate might face the solar cell matrix on one glass plate.

The assembly was set in a vacuum laminator. Once a vacuum was established by the standard procedure, the glass plates were heated at 100° C. and held for 5 minutes, and press bonded under atmospheric pressure for 5 minutes. A solar cell module having the solar cell matrix encapsulated therein was completed.

Example 2

A solar cell module was manufactured as in Example 1 except that the silicone coating was 550 μm thick and the seal member was changed as follows.

The base seal member was formed by dispensing the butyl rubber-based thermoplastic sealing material by means of a hot melt applicator and shaping into a band of rectangular shape in cross section having a width of 8 mm and a thickness of 3 mm.

The protrusive seal segments were formed by dispensing the butyl rubber-based thermoplastic sealing material by means of a hot melt applicator, shaping into a band of rectangular shape in cross section having a width of 4 mm and a height of 3 mm, and cutting the band into segments of 20 mm long. Four protrusive seal segments were arranged on the base seal member such that in width direction, each protrusive seal segment was at the center of the base seal member, and along four sides of frame-configured base seal member, one was positioned at the center in each of four sides.

Example 3

A solar cell module was manufactured as in Example 1 except that a peripheral region of each glass plate having a width of 10 mm was previously masked in a frame pattern with a masking tape, the silicone coating was formed of the composition of Synthesis Example 2 to a thickness of 350 μm, and the seal member was changed as follows.

The base seal member was formed by dispensing the butyl rubber-based thermoplastic sealing material by means of a hot melt applicator and shaping into a band of rectangular shape in cross section having a width of 5 mm and a thickness of 2 mm.

The protrusive seal segments were formed by dispensing the butyl rubber-based thermoplastic sealing material by means of a hot melt applicator, shaping into a band of rectangular shape in cross section having a width of 4 mm and a height of 3 mm, and cutting the band into segments of 20 mm long. Four protrusive seal segments were arranged on the base seal member such that in width direction, each protrusive seal segment was at the center of the base seal member, and along four sides of frame-configured base seal member, one was positioned at the center in each of four sides.

Example 4

A solar cell module was manufactured as in Example 1 except that the composition of Synthesis Example 2 was used, and the protrusive seal segments were changed as follows.

The protrusive seal segments were formed by dispensing the butyl rubber-based thermoplastic sealing material by means of a hot melt applicator, shaping into a band of rectangular shape in cross section having a width of 3 mm and a height of 1.5 mm, and cutting the band into segments of 20 mm long. Six protrusive seal segments were arranged on the base seal member such that in width direction, each protrusive seal segment was at the center of the base seal member, and along four sides of frame-configured base seal member, one was positioned at the center in each of two short sides, and two were equally spaced apart from the center in each of two long sides.

Example 5

A solar cell module was manufactured as in Example 1 except that the silicone coating was formed of the composition of Synthesis Example 2 to a thickness of 550 μm, and the seal member was changed as follows.

The base seal member was formed by dispensing the butyl rubber-based thermoplastic sealing material by means of a hot melt applicator and shaping into a band of rectangular shape in cross section having a width of 8 mm and a thickness of 3 mm.

The protrusive seal segments were formed by dispensing the butyl rubber-based thermoplastic sealing material by means of a hot melt applicator, shaping into a band of rectangular shape in cross section having a width of 4 mm and a height of 3 mm, and cutting the band into segments of 20 mm long. Six protrusive seal segments were arranged on the base seal member such that in width direction, each protrusive seal segment was at the center of the base seal member, and along four sides of frame-configured base seal member, one was positioned at the center in each of two short sides, and two were equally spaced apart from the center in each of two long sides.

Comparative Example 1

A solar cell module was manufactured as in Example 1 except that the solar cell matrix was rested on the silicone coating on one glass plate, with the light-receiving surface faced downward.

Comparative Example 2

A solar cell module was manufactured as in Example 1 except that the silicone coating had a thickness of 550 μm, and the seal member was changed as follows.

The base seal member was formed by dispensing the butyl rubber-based thermoplastic sealing material by means of a hot melt applicator and shaping into a band of rectangular shape in cross section having a width of 9 mm and a thickness of 2 mm.

The protrusive seal segments were formed by dispensing the butyl rubber-based thermoplastic sealing material by means of a hot melt applicator, shaping into a band of rectangular shape in cross section having a width of 4 mm and a height of 2 mm, and cutting the band into segments of 20 mm long. Four protrusive seal segments were arranged on the base seal member such that in width direction, each protrusive seal segment was at the center of the base seal member, and along four sides of frame-configured base seal member, one was positioned at the center in each of four sides.

Comparative Example 3

A solar cell module was manufactured as in Example 2 except that the composition of Synthesis Example 2 was used, and the protrusive seal segments were changed as follows.

The protrusive seal segments were formed by dispensing the butyl rubber-based thermoplastic sealing material by means of a hot melt applicator, shaping into a band of rectangular shape in cross section having a width of 4 mm and a height of 3 mm, and cutting the band into segments of 20 mm long. Three protrusive seal segments were arranged on the base seal member such that in width direction, each protrusive seal segment was at the center of the base seal member, and along four sides of frame-configured base seal member, one was located at the center in either one of two short sides, and one was located at one of two trisection positions on each of two long sides which one position was remoter from the one short side where one protrusive seal segment was positioned.

The solar modules thus manufactured were evaluated for sealed state. The sealed state was judged on two portions, the silicone seal portion (the region where the silicone coating was formed before the lamination step) and the butyl seal portion (the bare region where the silicone coating was not formed before the lamination step and which was sealed by the seal member), by calculating a porosity (%) in each seal portion on a basis of visual observation. The rating criterion is shown in Table 1. A seal portion with a porosity of less than 1% is rated "A" and regarded good because it has no or little influence on the quality and performance of a solar module. A seal portion with a porosity of less than 5% is rated "B" and regarded acceptable. A seal portion with a porosity of 5% or more is rated "C" or rejected because it has influence on the quality and performance of a solar module.

TABLE 1

| | Porosity over entire silicone seal portion | | |
|---|---|---|---|
| Silicone seal portion | <1% | <5% | ≥5% |
| Rating | A | B | C |
| | Porosity over entire butyl seal portion | | |
| Butyl seal portion | <1% | <5% | ≥5% |
| Rating | A | B | C |

The test results are shown in Table 2. Notably, the ratio (V2/V1) of the volume (V2) of the base seal member to the volume (V1) of a portion to be sealed (or seal portion) at the edge of the solar cell module is determined according to the following equation.

$$V2/V1 = (\text{thickness } t2 \times \text{width } W2 \text{ of base seal member}) / [(\text{total thickness } t1 \times 2 \text{ of silicone coating films}) \times (\text{width } W1 \text{ of panel peripheral or bare region})]$$

TABLE 2

| | | | Example | | | | | Comparative Example | | |
|---|---|---|---|---|---|---|---|---|---|---|
| | | | 1 | 2 | 3 | 4 | 5 | 1 | 2 | 3 |
| Glass plate | Bare region Width W1 (mm) | | 15 | 15 | 10 | 15 | 15 | 15 | 15 | 15 |
| Silicone coating | Composition | | Synthesis Example 1 | Synthesis Example 1 | Synthesis Example 2 | Synthesis Example 2 | Synthesis Example 2 | Synthesis Example 1 | Synthesis Example 1 | Synthesis Example 2 |
| | Thickness t1 (μm) | | 900 | 550 | 350 | 900 | 550 | 900 | 550 | 550 |
| Solar matrix | Solar cell orientation | | light receiving side upward | light receiving side upward | light receiving side upward | light receiving side upward | light receiving side upward | light receiving side downward | light receiving side upward | light receiving side upward |
| Seal member | Base seal member | Width W2 (mm) | 12 | 8 | 5 | 12 | 8 | 12 | 9 | 8 |
| | | W2/W1 × 100 (%) | 80 | 53 | 50 | 80 | 53 | 80 | 60 | 53 |
| | | Thickness t2 (mm) | 3 | 3 | 2 | 3 | 3 | 3 | 2 | 3 |

TABLE 2-continued

|  |  | Example | | | | | Comparative Example | | |
| --- | --- | --- | --- | --- | --- | --- | --- | --- | --- |
|  |  | 1 | 2 | 3 | 4 | 5 | 1 | 2 | 3 |
|  | Ratio* V2/V1 | 1.33 | 1.45 | 1.43 | 1.33 | 1.45 | 1.33 | 1.09 | 1.45 |
| Protrusive seal segments | Width (mm) | 4 | 4 | 4 | 3 | 4 | 4 | 4 | 4 |
|  | Height h (mm) | 2 | 3 | 3 | 1.5 | 3 | 2 | 2 | 3 |
|  | Number | 6 | 4 | 4 | 6 | 6 | 6 | 4 | 3 |
| Evaluation results | Silicone seal portion | A | A | A | B | B | C | C | C |
|  | Butyl seal portion | A | A | A | A | B | A | C | B |
|  | Remarks | good | good | good | silicone seal portion: some pores observed | silicone and butyl seal portions: some pores observed | silicone seal portion: many pores observed on light receiving side of cell components | silicone and butyl seal portions: many pores observed | silicone seal portion: pores observed locally |

*V2/V1 = (t2 × W2)/[(t1 × 2) × W1]

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims.

Japanese Patent Application Nos. 2013-140539 and 2014-124107 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a solar cell module by resin encapsulating a solar cell matrix comprising a plurality of electrically connected solar cell components between two panels, comprising the steps of:
   (i) forming a silicone coating film on one surface of each of two panels, excluding a peripheral region of the one surface,
   (ii) placing the solar cell matrix on the silicone coating film on one panel, such that in case the solar cell component is of monofacial light receiving type, the light receiving side may face upward, and in case the solar cell component is of bifacial light receiving type, either one light receiving side may face upward,
   (iii) providing a base seal member on the peripheral region of the silicone coating film-bearing surface of either one panel where the silicone coating film is not formed, said seal member comprising a butyl rubber-based thermoplastic sealing material and being thicker than the silicone coating film on the panel, such that a ratio of the volume (V2) of the base seal member to the volume (V1) of a seal portion, which is given as the total thickness of the silicone coating films on the panels multiplied by the width of the peripheral region of the surface of the base seal member-bearing panel where the silicone coating film is not formed, may range from 1.2/1 to 1.5/1, and then
   providing protrusive seal segments on the base seal member at four or more spaced-apart positions, said protrusive seal segments comprising a butyl rubber-based thermoplastic sealing material and having a height of 1 to 4 mm,
   (iv) mating the two panels together such that the silicone coating film-bearing surface of the panel on which the solar cell matrix is not placed may be opposed to the solar cell matrix, a seal member consisting of the base seal member and protrusive seal segments may abut against a peripheral region of the panel on which the seal member is not provided where the silicone coating film is not formed, and the solar cell matrix may be sandwiched between the silicone coating films,
   (v) evacuating a space in which the mated panels are placed to vacuum, compressing and heating the mated panels in vacuum for establishing a seal around the solar cell matrix.

2. The method of claim 1 wherein step (iii) includes previously forming the base seal member in tape form and the protrusive seal segments, placing the base seal member on the peripheral region of the silicone coating film-bearing surface of either one panel where the silicone coating film is not formed, and then placing the protrusive seal segments on the base seal member at four or more spaced-apart positions.

3. The method of claim 1 wherein step (iii) includes previously forming the base seal member in tape form and the protrusive seal segments, placing the protrusive seal segments on the base seal member at four or more spaced-apart positions to form a seal member, and then placing the seal member on the peripheral region of the silicone coating film-bearing surface of either one panel where the silicone coating film is not formed.

4. The method of claim 1 wherein the silicone coating film is a silicone gel film formed by coating and curing a curable silicone gel composition and having a penetration of 30 to 200 as measured according to JIS K2220.

5. The method of claim 1 wherein the silicone coating film has a thickness of 200 to 1,000 μm.

6. The method of claim 1 wherein step (v) includes heating the mated panels in vacuum at a temperature of 70 to 120° C.

7. The method of claim 1 wherein step (v) is carried out using a vacuum laminator.

8. The method of claim 1 wherein at least one of the two panels is a transparent plate.

9. A method for manufacturing a solar cell module by resin encapsulating a solar cell matrix comprising a plurality of electrically connected solar cell components between two panels, comprising the steps of:

(i) forming a silicone coating film on one surface of each of two panels, excluding a peripheral region of the one surface, (ii) placing a solar cell matrix on the silicone coating film on one panel, such that in case the solar cell component is of monofacial light receiving type, the light receiving side may face upward, and in case the solar cell component is of bifacial light receiving type, either one light receiving side may face upward, (iii) providing a base seal member on the peripheral region of the silicone coating film-bearing surface of either one panel where the silicone coating film is not formed, said seal member comprising a butyl rubber-based thermoplastic sealing material and being thicker than the silicone coating film, such that a ratio of the volume (V2) of the base seal member to the volume (V1) of a seal portion, which is given as the total thickness of the silicone coating films on the panels multiplied by the width of the peripheral region of the surface of the base seal member-bearing panel where the silicone coating film is not formed, may range from 1.2/1 to 1.5/1, and providing protrusive seal segments on the peripheral region of the silicone coating film-bearing surface of the other panel where the silicone coating film is not formed, at four or more spaced-apart positions, said protrusive seal segments comprising a butyl rubber-based thermoplastic sealing material and having a height of 1 to 4 mm, (iv) mating the two panels together such that the silicone coating film-bearing surface of the panel on which the solar cell matrix is not placed may be opposed to the solar cell matrix, the protrusive seal segments may abut against the base seal member, and the solar cell matrix may be sandwiched between the silicone coating films, (v) evacuating a space in which the mated panels are placed to vacuum, compressing and heating the mated panels in vacuum for establishing a seal around the solar cell matrix.

10. The method of claim 9 wherein step (iii) includes previously forming the base seal member in tape form and the protrusive seal segments, placing the base seal member on the peripheral region of the silicone coating film-bearing surface of either one panel where the silicone coating film is not formed, and placing the protrusive seal segments on the peripheral region of the silicone coating film-bearing surface of the other panel where the silicone coating film is not formed, at four or more spaced-apart positions.

* * * * *